United States Patent
Takahashi et al.

(10) Patent No.: US 7,635,978 B2
(45) Date of Patent: Dec. 22, 2009

(54) NUCLEAR MAGNETIC RESONANCE IMAGING APPARATUS AND METHOD

(75) Inventors: Tetsuhiko Takahashi, Tokyo (JP); Yumiko Yatsui, Toyokawa (JP); Koji Kajiyama, Kamagaya (JP); Hideki Kumai, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 123 days.

(21) Appl. No.: 11/918,082

(22) PCT Filed: Mar. 22, 2006

(86) PCT No.: PCT/JP2006/305722

§ 371 (c)(1),
(2), (4) Date: Oct. 8, 2007

(87) PCT Pub. No.: WO2006/109472

PCT Pub. Date: Oct. 19, 2006

(65) Prior Publication Data

US 2009/0066328 A1    Mar. 12, 2009

(30) Foreign Application Priority Data

Apr. 11, 2005    (JP)    ............... 2005-113467

(51) Int. Cl.
*G01V 3/00*    (2006.01)
(52) U.S. Cl. ...................... 324/309; 324/306
(58) Field of Classification Search ........... 324/309, 324/306

See application file for complete search history.

(56) References Cited

U.S. PATENT DOCUMENTS 5,566,218 A  *  10/1996  Nobuta et al.

(Continued)

FOREIGN PATENT DOCUMENTS

JP    6-311977    *  11/1994

(Continued)

OTHER PUBLICATIONS

David G. Kruger et al., "Continuously Moving Table Data Acquisition Method for Long FOV Contrast-Enhanced MRA and Whole-Body MRI," *Magnetic Resonance in Medicine*, Feb. 2002, vol. 47., No. 2, pp. 224-231.*

(Continued)

*Primary Examiner*—Louis M Arana
(74) *Attorney, Agent, or Firm*—Cooper & Dunham, LLP

(57) ABSTRACT

A control means controls an imaging means for taking an image of a test object by a magnetic resonance, the test object being placed in an imaging space, and a transfer means that moves the test object, and on the basis of a difference (moving distance) between a position of the transfer means at the time of receiving a command of pausing the imaging and a position of the transfer means at the time of resuming the imaging, the control means controls the position of the transfer means or the position for imaging at the time of resuming, in such a manner that missing of data 503 caused by the difference can be compensated. With this configuration, it is possible to provide an MRI apparatus that is provided with an imaging pause function, and even when the pause function is activated, there is data consistency between the data before the pausing and the data after the resuming, thereby obtaining a high quality image.

23 Claims, 9 Drawing Sheets

U.S. PATENT DOCUMENTS

| | | | |
|---|---|---|---|
| 6,963,768 B2 * | 11/2005 | Ho et al. | 600/415 |
| 7,417,430 B2 * | 8/2008 | Aldefeld et al. | 324/309 |
| 7,474,096 B2 * | 1/2009 | Hanawa | 324/306 |
| 2003/0216637 A1 * | 11/2003 | Ho et al. | |

FOREIGN PATENT DOCUMENTS

| | | | |
|---|---|---|---|
| JP | 7-194592 | * | 8/1995 |
| JP | 2004-611 | * | 1/2004 |

OTHER PUBLICATIONS

M.O. Zenge et al., "MR Imaging with a Continuously Rolling Table Platform and High-Precision Position Feedback," *Magnetic Resonance in Medicine*, May 2005, vol. 12, p. 2381.*

* cited by examiner

FIG.3
(a)
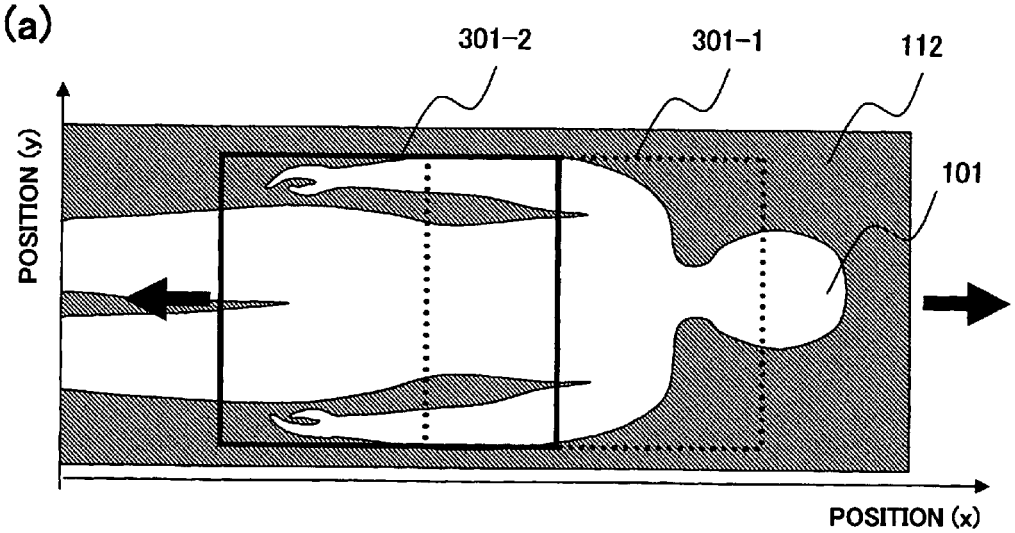
(b)
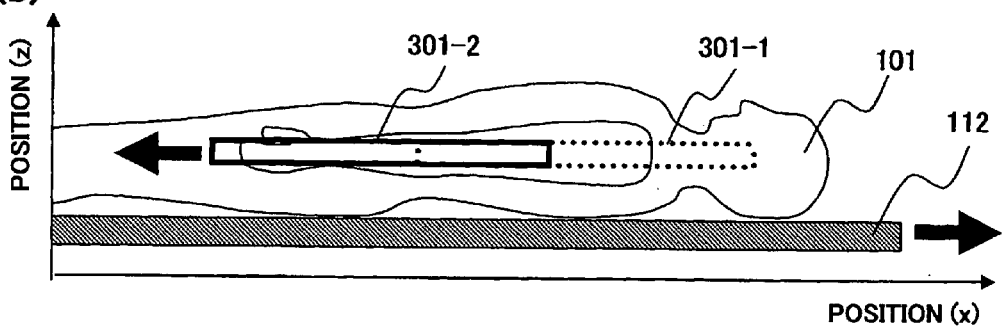
(c)
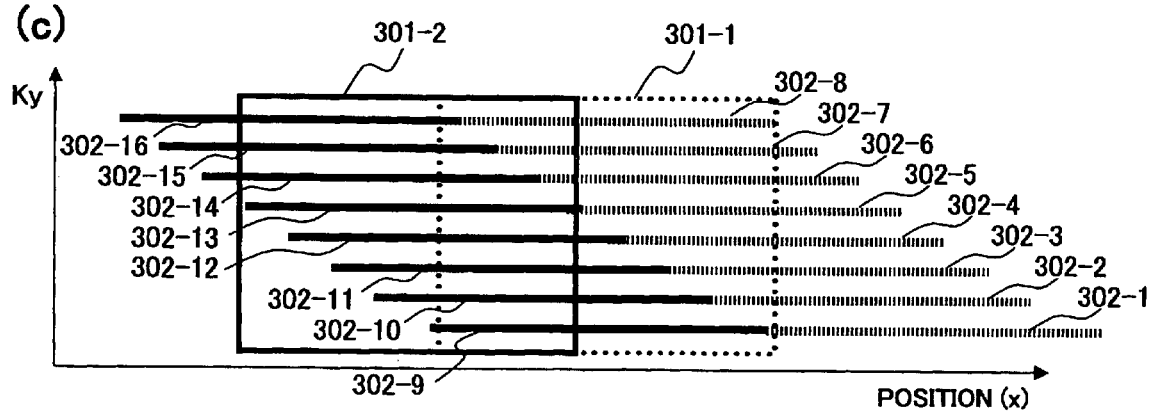

FIG.5
(a)
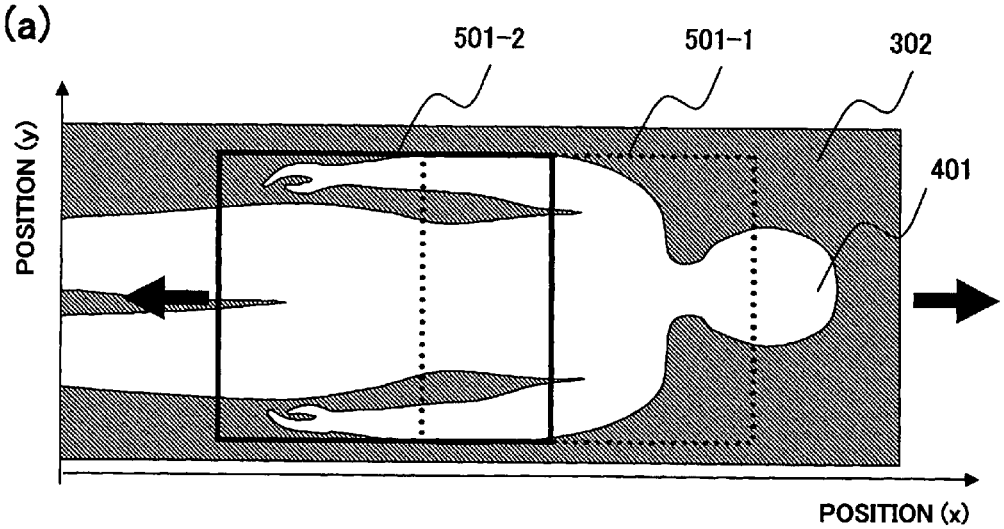
(b)
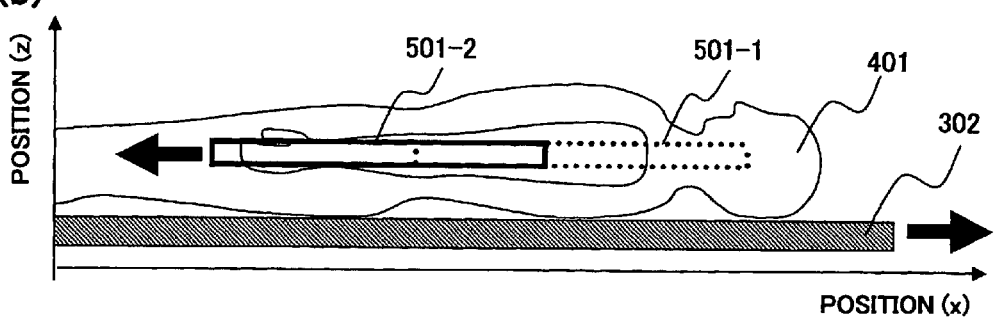
(c)
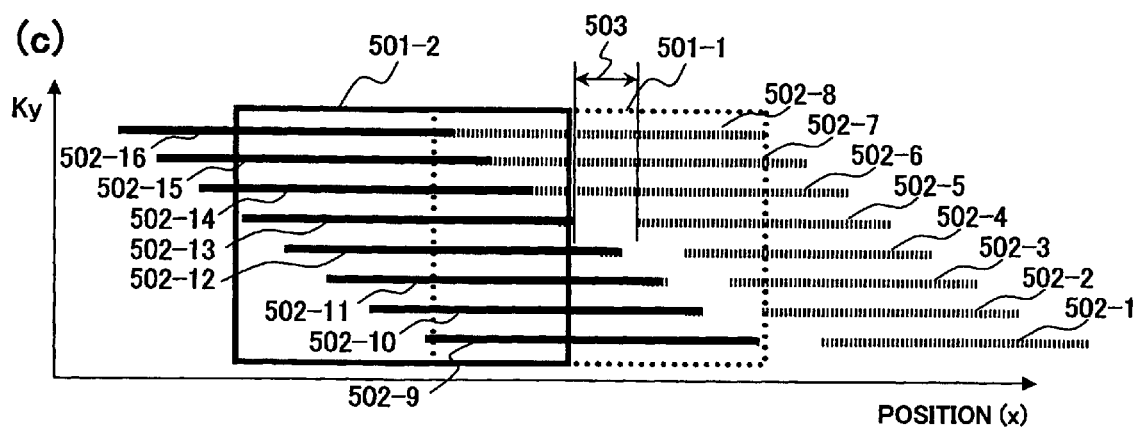

FIG.6
(a)
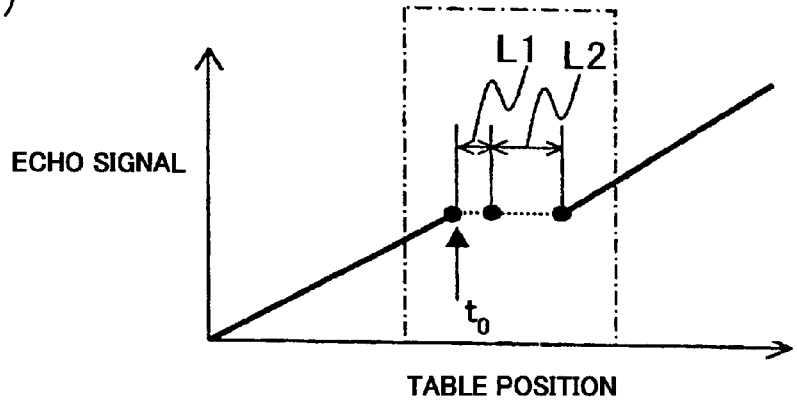
(b)
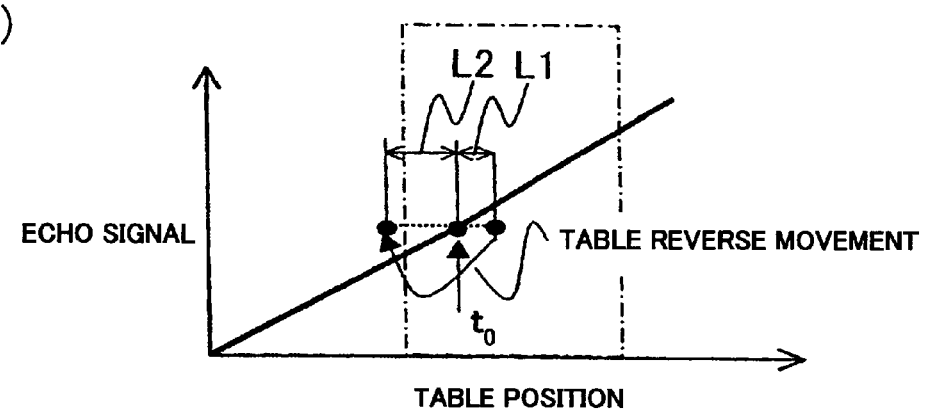
(c)
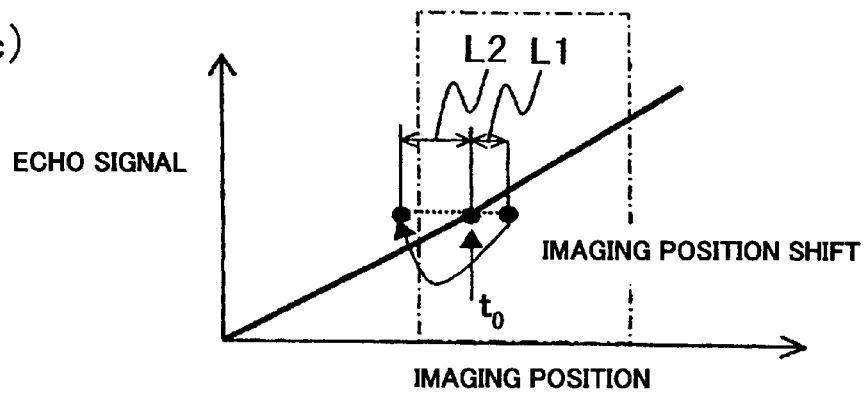
(d)
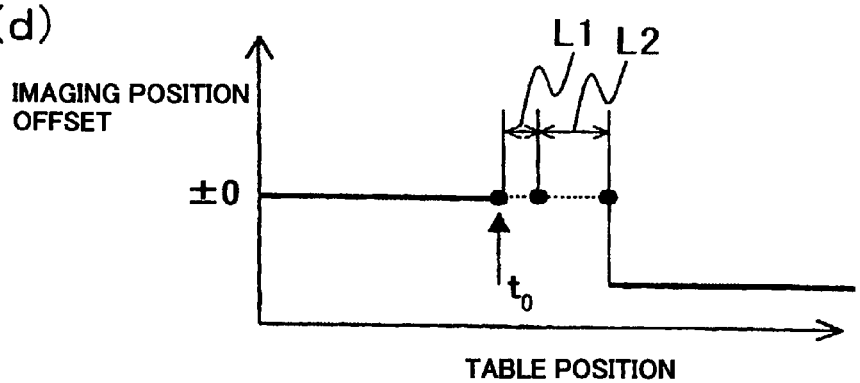

FIG.8
(a)
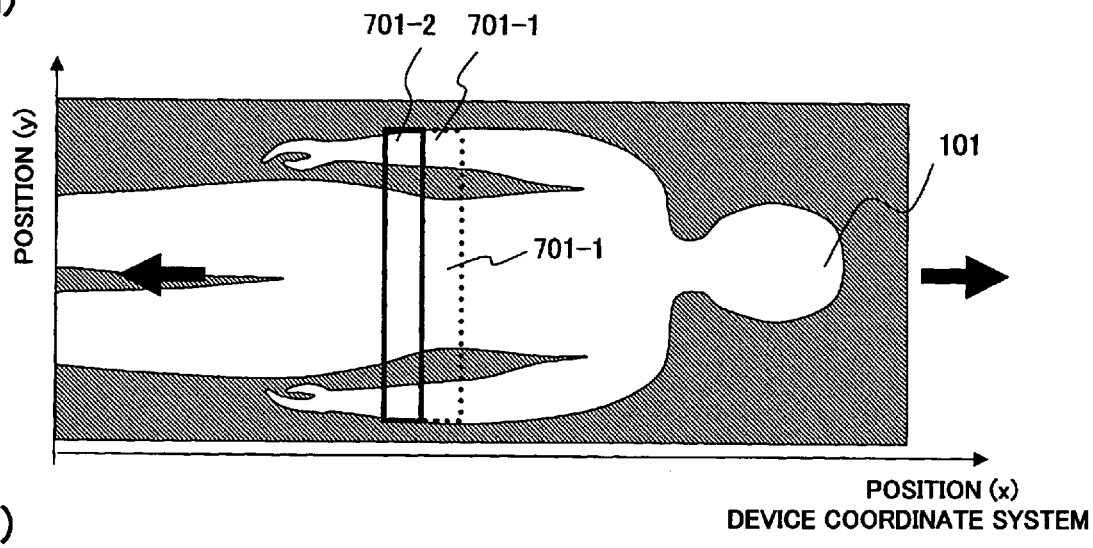
(b)
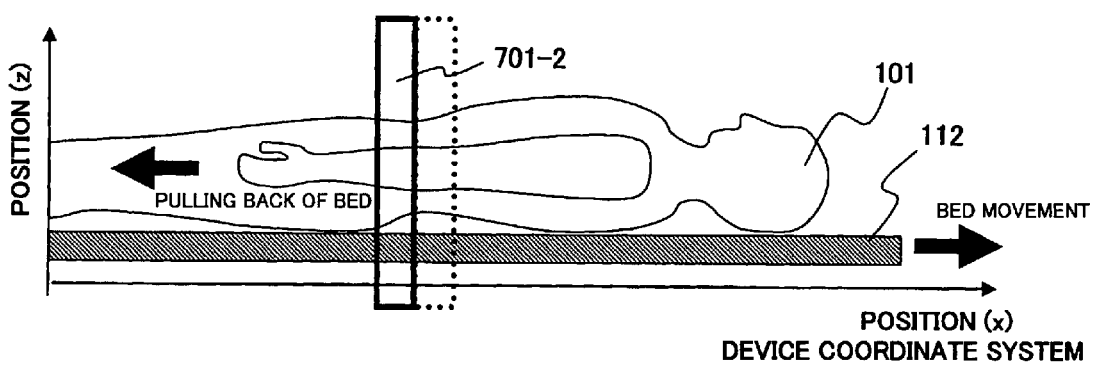
(c)
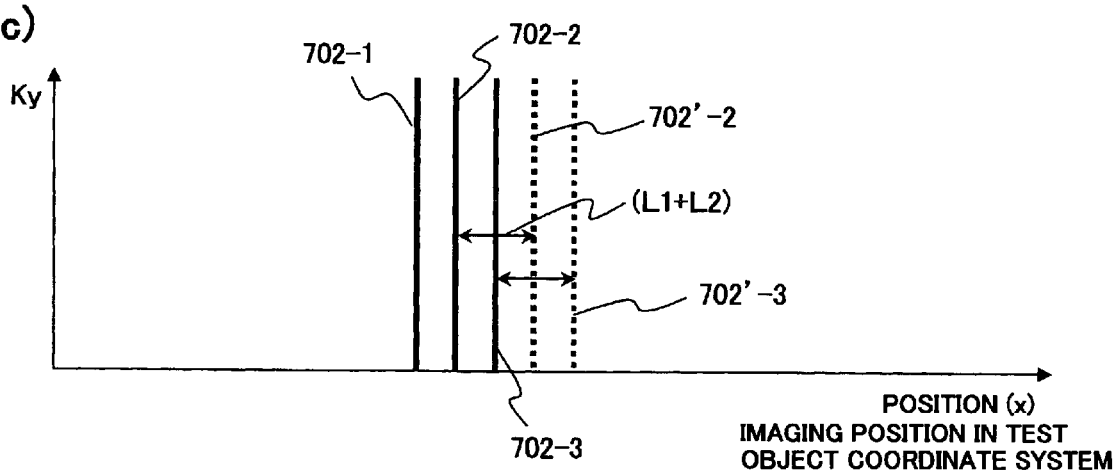

NUCLEAR MAGNETIC RESONANCE IMAGING APPARATUS AND METHOD

TECHNICAL FIELD

The present invention relates to a nuclear magnetic resonance imaging (MRI) apparatus that measures a nuclear magnetic resonance (NMR) signal issued from hydrogen, phosphor, and the like within a test object (subject to be examined), and visualizes a nuclear density distribution, a relaxation time distribution, and the like. In particular, it relates to an MRI apparatus that is capable of preventing a deterioration of an image due to an interruption and resuming of imaging, in the case where a moving bed imaging is carried out. In the moving bed imaging, an image is taken while moving a table (bed) on which the test object is placed, so that an image over a wide area of the test object is taken.

BACKGROUND ART

An MRI apparatus applies a gradient magnetic field and a high frequency magnetic field pulse to a test object placed in a static magnetic field space, receives an NMR signal generated from the test object, and creates an image of the test object. Therefore, a part of the test object that is available as a target of the imaging by the MRI apparatus has been limited to the part placed in the static magnetic field space. However, by the use of a high-speed imaging technique of recent years, it is now possible to take an image of a total body while moving a bed on which the test object is placed. The method to take an image while moving the bed is referred to as a moving bed method, and various means have been proposed so far (for example, see patent document 1).

[Patent document 1]
Japanese Published Unexamined Patent Application No. 2002-10992

DISCLOSURE OF THE INVENTION

Problem to be Solved by the Invention

When an imaging by the MRI apparatus is applied to a clinical use, there may be a case where the imaging is interrupted by an accidental change in situation after the start of imaging. By way of example, it is conceivable that the test object may be in motion, or an operator may communicate with the test object for checking. When the imaging is interrupted as described above during the moving bed imaging, even if movement of the bed is brought to a halt simultaneously with the interruption and the imaging is resumed thereafter, there is not a positional consistency between the data before the halt and the data after the halt. It is because, as one conceivable reason, even if a command for halting the bed movement is transmitted simultaneously with a command for the temporary halt of imaging, an overrun may occur due to dependence on performance capabilities of the bed drive mechanism. In addition, in the moving bed imaging, it is necessary to set the bed moving speed constant with respect to the imaging speed, and therefore, there are circumstances that the imaging cannot be started until the bed is brought into a uniform motion after the resuming of the bed movement.

In the moving bed imaging where the bed moving direction is the same as a readout gradient magnetic field direction, one echo data is generally used for image reconstruction as to multiple areas (FOV) of the test object. However, if a part of the data belonging to any of the areas is wasted due to the interruption of imaging, it has been necessary to obtain the entire data once again.

SUMMARY

In an aspect of this disclosure, there is provided an MRI apparatus that is capable of performing the moving bed imaging, the apparatus being equipped with a function of pausing the imaging, and even when the pause function is activated, there is consistency between the data before the pausing and the data after the pausing, whereby a high-quality image can be obtained.

In another aspect of this disclosure, there is provided an MRI apparatus which avoids wasting of data having been measured, without the need of redoing, and which is, in effect capable of preventing elongation of measuring time.

In another aspect of this disclosure, there is provided a MRI apparatus that includes a static magnetic field generation means, a transfer means for moving a test object relative to a static magnetic field space generated by the static magnetic field generation means, an imaging means for applying a high-frequency magnetic field and a gradient magnetic field to the static magnetic field space, receiving a nuclear magnetic resonance signal generated from the test object, and forming a magnetic resonance image of the test object, and a control means for controlling a movement by the transfer means and an imaging by the imaging means, wherein the MRI apparatus is further provided with an input means for sending to the control means, a command of pausing the imaging and a command of resuming the imaging.

The control means controls an operation of the transfer means and/or the imaging means at the time of resuming, based on positional information of the transfer means at the time of receiving the command of pausing the imaging, and the positional information of the transfer means at the time of resuming the imaging. For example, the control of the operation of the transfer means and/or the imaging means at the time of resuming is conducted in such a manner as compensating missing data, which is caused by a difference of positional information (moved distance) between the time of receiving the command of pausing the imaging and the time of resuming the imaging.

According to the above-mentioned MRI apparatus, even though the pausing and resuming of imaging occur while the imaging is performed with the movement of the transfer means, it is possible to obtain the data being continuous in the moving direction of the transfer means, just like performing the imaging continuously. Therefore, an image having a wide view being continuous in the moving direction of the transfer means can be obtained.

In the above-mentioned MRI apparatus, the moved distance of the transfer means includes, for example, an overrun until the operation of the transfer means is stopped after receiving the command of pausing. In the above-mentioned MRI apparatus, the moved distance of the transfer means further includes a distance that the transfer means moves from restarting of movement by the command of resuming until the imaging is started. Accordingly, it is possible to maintain data continuity with reliability, regardless of characteristics of the transfer means.

In the above-mentioned MRI apparatus, the control means compensates the moved distance by restoring the position of the transfer means when the operation of the imaging means is resumed, by the distance that is equal to the moved distance. Alternatively, the control means compensates the moved distance by shifting an imaging position when the operation of the imaging means is resumed, by the distance that is equal to the moved distance.

The MRI apparatus according to another exemplary embodiment is further provided with a storage unit that stores data having been obtained until the pausing. The control means controls the imaging means so that an image is reconstructed, by using a part of the data obtained until the pausing and the data obtained after the resuming.

In another aspect of this disclosure, there is provided a nuclear magnetic resonance imaging method that includes the steps of, (1) taking an image of a test object, while allowing movement of the test object on which a high-frequency magnetic field and a gradient magnetic field are applied, and receiving a nuclear magnetic resonance signal, (2) pausing the imaging and the movement, (3) resuming the imaging and the movement, (4) detecting a pausing position of the test object being paused and a resuming position of the test object being resumed, and (5) controlling the movement and the imaging of the test object at the time of resuming in such a manner as compensating a data missing, based on a difference between the pausing position and the resuming position, where the data missing occurs due to the difference.

In the above-mentioned nuclear magnetic resonance imaging method, the step (1) includes the steps of, (6) storing the nuclear magnetic resonance signal obtained until the pausing, and (7) storing the nuclear magnetic resonance signal obtained after the resuming, and further including the step of (8) reconstructing an image based on the nuclear magnetic resonance signals obtained in the step (6) and in the step (7).

Thus, an input means for sending to the control means, a command of pausing the imaging and a command of resuming the imaging are provided, whereby imaging control in the continuous moving imaging can be easily performed. In particular, since there is provided a means for compensating a discrepancy between the transfer means and an imaging plane, which may occur during the time between the pausing and the resuming of the imaging, it is possible to prevent a deterioration of an image, which is caused by the discrepancy. In addition, the data obtained until the pausing is not wasted and it can be used for the image reconstruction together with the data after the resuming.

BEST MODE FOR CARRYING OUT THE INVENTION

Hereinafter, the MRI apparatus according to the present invention will be explained in detail, with reference to the accompanying drawings. FIG. 1 is a block diagram showing an overview of the MRI apparatus to which the present invention is applied. This MRI apparatus includes a magnet 102 that generates a static magnetic field in a space where a test object 101 is placed, a gradient magnetic field coil 103 that generates a gradient magnetic field in the space (static magnetic field space), an RF coil 104 that generates a high-frequency magnetic field that excites atomic nuclei of atomic element constituting a tissue of the test object 101, an RF probe 105 that detects an MR signal generated from the test object 101, and a bed 112 that moves the test object 101 in the static magnetic field space. Bed controller 114 controls the drive of the bed 112, for example, the bed 112 is allowed to move in the body axis direction (H-F direction) of the test object 101. A position of the bed 112 can be detected by a position detecting mechanism 115 such as an encoder that is provided in the bed controller 114.

The gradient magnetic field coil 103 is made up of gradient magnetic field coils in three directions X, Y, and Z, and gradient magnetic fields are generated respectively, in response to a signal from the gradient magnetic field power source 109. Accordingly, an imaging plane of the test object 101 is selected, and positional information is added to an MR signal. In the MRI apparatus, the gradient magnetic fields in the slice direction, phase encoding direction, and readout direction are used generally, and they are respectively combined with the gradient magnetic field coils in the three directions, thereby allowing a selection of any direction with respect to a device coordinate system.

The RF coil 104 generates a high-frequency magnetic field, in response to a signal from the RF transmitter 110. A frequency of the high-frequency magnetic field generated by the RF coil 104 is set to a resonance frequency of nuclear spin being a target of examination in the static magnetic field intensity. The nuclear spin as the target of examination is usually a proton, but it is not limited to this. A signal from the RF probe 105 is detected in the signal detector 106, then, the signal is subjected to the signal processing in the signal processor 107, and thereafter converted into image data by calculation. Data in the course of calculation and image data are stored in the storage unit 113. The image data is displayed in the display unit 108 as an image.

Operations of the gradient magnetic field power source 109, the RF transmitter 110, and the signal detector 106 are controlled by the controller 111, in conformity to a pulse sequence that is determined by the imaging method. The controller 111 controls the bed controller 114 along with the control of the imaging in conformity to the pulse sequence, so that the imaging speed and the bed moving speed are kept in appropriate relationship, and also performs a control necessary for pausing and resuming the imaging. In the controller 111, there is provided an input means for inputting a command necessary for the control, though it is not illustrated, allowing a selection of pulse sequence, a setting of a parameter required for the imaging, and further an input of a command of pausing and a command of resuming after the imaging.

The MRI apparatus according to the present invention is provided with a function in which the controller 111 compensates a data missing during the pausing, in response to the command of pausing the imaging and the command of resuming the imaging as described above. The data missing is caused primarily by a minute displacement between the imaging plane and the bed position, which occurs during the time between the pausing and the resuming. In receipt of the command of pausing or the command of resuming, the controller 111 calculates a minute displacement between the imaging plane and the bed position, and performs a fine adjustment of the bed position and/or the imaging plane so that they are placed on the original positions at the time of pausing. Simultaneously, the data measured by the imaging until the pausing is stored, and the image is reconstructed by using a part of the stored data as appropriate.

Details of the receiving system and the controller 111, which perform the functions as described above, are shown in FIG. 2. An echo signal detected by the receiving coil 201 constituting the RF probe 105 is amplified by the preamplifier 202 provided for each receiving coil, and then, in the signal detection unit 106, the echo signal is subjected to AD conversion and quadrature detection in the AD converter and the quadrature detection circuit 203 during a predetermined sampling time, by using a reference RF signal, and thereafter, converted into two series digital signal. The two sequence digital signal is stored sequentially in the storage unit 113 as k-spatial data, simultaneously subjected to Fourier transform for every pair of data in the signal processor 107, and restructured into image data. If the RF probe 105 is made up of multiple receiving coils 201, image data of each receiving coil is synthesized in the synthetic circuit 205. Also when a total body image is produced from multiple image data items, those data items are synthesized in the synthetic circuit 205.

When a command of pausing the imaging (PAUSE) is inputted from the input unit 116 during the imaging process, the controller 111 reconstructs an image by using a part of the data obtained so far, and a remaining part is stored in the storage unit 113 for reconstructing an image together with the data obtained after the resuming. The controller 111 further calculates an overrun of the bed after the pausing and a moving amount after the resuming (accelerating-distance), which is a distance until the bed moving speed reaches a speed at which the imaging is possible. According to the calculation result, fine adjustment of the imaging plane or the bed position at the time of resuming the imaging is performed. For example, the fine adjustment of the imaging plane is carried out by changing a detection phase of an RF at the time of echo receiving. Details thereof will be described below. When a command of resuming the imaging (RESUME) is inputted from the input unit 116, movement of the bed is started via the bed controller 114, and when the speed of the bed movement becomes constant, the imaging is started.

Next, the moving bed imaging will be explained, which is executed in the MRI apparatus having a configuration as described above.

FIG. 3 includes illustrations showing a first embodiment of the moving bed imaging according to the present invention. In this embodiment, imaging is performed setting a COR section as an imaging plane, while the bed is moved in H-F direction (x-direction) of the test object 101. During the imaging, a field of view (FOV) is fixed with respect to a device coordinate system. FIG. 3(a) and FIG. 3(b) are respectively a plan view and a side view, showing a relationship between the test object 101 and the imaging planes 301-1 and 301-2. FIG. 3(c) is an illustration showing data, after the echo signals 302-1 to 302-16 obtained at the time of imaging are subjected to the Fourier transform in the readout direction.

A publicly known high-speed sequence may be employed as a pulse sequence for the imaging. By way of example, FIG. 4 shows a general 2D gradient echo sequence. In the 2D gradient echo sequence, an RF pulse 401 having a frequency that excites nuclear spins of the test object is applied together with a selecting gradient magnetic field 402 for selecting an imaging plane, and next, the gradient magnetic field 404 in the phase encoding direction is applied. Then, while applying the readout gradient magnetic field 405, an echo signal 406 is measured after a lapse of the echo time 407 from the application of the excitation RF pulse 401. In the embodiment as shown in FIG. 3, the COR plane is set as an imaging plane. Therefore, the slice direction (z-direction) is set as a direction orthogonal to the bed moving direction, the phase encoding direction (y-direction) is set as the left and right direction of the test object, and the readout direction (x-direction) is set as a bed moving direction.

Such sequence as described above is repeated at a predetermined repetition time 408, while varying the intensity of the phase encoding gradient magnetic field 404. In a normal imaging that is performed in the state where the bed is fixed, the imaging is completed by repeating the sequence for the number of repetition counts required for one set of 2D image data items (i.e., the phase encoding number, or slice encoding number×phase encoding number, if the image is 3D). However, in the moving bed imaging, the FOV on the test object is changed according to the bed movement, and therefore, the sequence in FIG. 4 is repeated until image data of multiple sections associated with multiple FOVs are obtained. In this case, the bed speed and the imaging speed are controlled, so that the speed at which the bed moves over one FOV is rendered to be equal to the speed at which obtaining the image data corresponding to one imaging plane is completed.

FIG. 3(c) illustrates that the echo signals 302 obtained as described above are subjected to the Fourier transform in the x-direction, and the signals are arranged in the associated positions in the x-direction. In the figure, the last number of the reference numeral indicating the echo signal is an echo number (acquisition number of the signal). This figure shows, for the ease of explanation, the case where the phase encoding number is 8 (eight), that is, the phase encoding in the y-direction is completed by eight echoes.

In other words, for example, while the phase encoding is varied sequentially, the echoes 302-1 to 302-8 are acquired, and when measurement of the entire phase encoding is ended, the phase encoding is returned to the same as the echo 302-1. Then, the echo 302-9 to echo 302-16 are acquired. When the echo 302-16 is acquired, it means that all the signals necessary for reconstructing the imaging plane 301-1 can be obtained. Therefore, the data corresponding to the imaging plane 301-1 (data within the frame surrounding by the dotted line in FIG. 3(c)) is subjected to Fourier transform in the y-direction, and thereby reconstructing the image data of the imaging plane 301-1. Thereafter, imaging is performed while the bed is moved continuously, and every time when all the data items of each imaging plane are obtained, they are subjected to the Fourier transform, and thereby reconstructing the image data of each imaging plane.

In the course of such imaging, if a command of pausing the imaging (PAUSE) is inputted via the input unit 116, the controller 111 controls the bed controller 114 and the imaging system (gradient magnetic field power source 109, RF transmitter 110, and signal detector 106), and halts the bed as well as stopping the imaging. At this point of time, for example, as shown in FIG. 5(c), if the echoes 502-1 to 502-5 have already been acquired, the controller 111 stores the imaging condition (phase encoding number) at the time of measuring the last echo signal 502-5, and performs an image reconstruction by using data among the data of the echoes 502-1 to 502-5, which is available for the image reconstruction together with the previous data. The part of the data that has not been used for the image reconstruction is stored in the storage unit.

Next, in order to avoid the data missing from the imaging pause point of time t0 to the resuming time, the controller 111 calculates the total (L1+L2), which is obtained by adding a distance L1 that the bed has moved by the overrun after the imaging pause, and a distance L2 that the bed has to move until the speed reaches a predetermined speed from the speed zero. Then, by the distance corresponding to the calculated total, the bed is moved in a reverse direction from the position where the bed stopped after the overrun. If such operation as described above is not performed, as shown in FIG. 6(a), the bed position is moved from the imaging pause point of time t0, by the distance obtained by adding the distance L1 moved by the overrun after the pausing and the distance L2 (accelerating distance) that the bed has moved after the resuming until reaching the speed enabling the imaging. Therefore, as shown in FIG. 5(c), if the imaging is started at the echo number continuous to the echo number just before the imaging pause, missing of data 503 occurs between the data 502-1 to 502-5 obtained before the pausing and resuming, and the data 502-9 to 502-13 obtained thereafter.

On the other hand, as shown in FIG. 6(b), if the bed is pulled back prior to the resuming, by the distance obtained by adding the overrun distance L1 and the moving distance L2 until the speed reaches a predetermined speed, the imaging plane is located at completely the same position as the position where the imaging was paused, at the point of time when the imaging is restarted after receiving a command of resuming (RESUME) and moving the bed till the speed of the bed becomes the predetermined speed. Therefore, even if the imaging is started at the echo number being continuous, imaging can be continued without occurrence of missing of data (i.e., without causing a deterioration of the image). The data obtained after the resuming can be continuously stored in the data space (k space) in the same manner as the data previously obtained, and there is no waste of data.

It is to be noted here that the distance L1 corresponding to the overrun after the pausing of the bed, and the distance L2 that the bed moves by the time of reaching a predetermined speed can be detected from the position detecting mechanism 115, such as an encoder provided in the bed controller 114. The controller 111 can calculate a distance to move the bed in the reverse direction, by using the distance obtained from the position detecting mechanism 115. Alternatively, the distance for the overrun and the distance for accelerating are values determined by a property of the bed and its drive mechanism, once the speed at which the imaging on the bed is performed is determined. Therefore, these values may be stored in advance as a function of the bed moving speed, and used for the calculation.

According to the present embodiment, it is configured such that the bed is moved in the reverse direction considering the moving amount of the bed, which has moved during the time from the pausing to the resuming, by receiving a command of pausing and a command of resuming from the input unit. Therefore, it is possible to reconstruct the image data without any deterioration in image, without wasting the data until the pausing of imaging, which is combined with the data obtained after the resuming.

In the present embodiment, there has been explained a case where the bed is moved in the reverse direction, in accordance with the moving amount of the bed that moves during the time from the pausing the imaging to the resuming the imaging. However, instead of the reverse movement of the bed, it is also possible to shift the imaging position in accordance with the bed moved amount. In other words, if there are an overrun and an accelerating distance between the imaging pause and resuming, the imaging plane shifts by that distance. Therefore, if the imaging is started by adjusting the imaging plane after the resuming, to the position after the shift, as shown in FIG. 6(c), the imaging position becomes continuous between the pausing time and the resuming time, when the horizontal axis represents the imaging position. Therefore, there is no missing of data, and an image can be reconstructed by the use of data of both before and after. FIG. 6(d) shows how the offset of the imaging plane position is changed between the pausing time and the resuming time.

For example, the change of the imaging plane can be implemented by changing a detected phase of an RF at the time of echo receiving. More specifically, following process will be performed.

An MRI signal S generally detected is expressed by the following equation (1), when the imaging plane is assumed as (x, y) and the imaging center is assumed as (x, y)=(0, 0):

[FORMULA 1]

$$S = \int\int M(x,y,z) R(x,y,z) \exp\{(-i\gamma/2\pi)(G_x x t_x + G_y y t_y)\} dx dy \quad (1)$$

Here, γ represents a gyromagnetic ratio, M(x, y, z) represents magnetization distribution, R(x, y, z) represents sensitivity distribution of the receiving coil, Gx represents a gradient magnetic field intensity in the x-direction, tx represents an application time of the x-direction gradient magnetic field, Gz represents a gradient magnetic field intensity in the z-direction, and tz represents an application time of the z-direction gradient magnetic field.

As shown in FIG. 3, in the case where the bed moving direction is along the frequency encoding axis (x-direction), when the imaging center at the time of pausing is assumed as (x, y)=($x_0$, 0), the signal $S_0$ at this timing is expressed by the equation (2), and the signal $S_1$ when the position of the imaging slice is displaced only by Δx after the resuming is expressed by the equation (3).

[FORMULA 2]

$$S_0 = \quad (2)$$
$$\int\int M(x,y,z)R(x,y,z)\exp\{(-i\gamma/2\pi)\{G_x(x+x_0)t_x + G_y y t_y\}\}dxdy$$
$$= \exp\{(-i\gamma/2\pi)G_x x_0 t_x\}$$
$$\int\int M(x,y,z)R(x,y,z)\exp\{(-1\gamma/2\pi)(G_x x t_x + G_y y t_y)\}dxdy$$

$$S_1 = \int\int M(x,y,z)R(x,y,z) \quad (3)$$
$$\exp\{(-i\gamma/2\pi)\{G_x(x+x_0+\Delta x)t_x + G_y y t_y\}\}dxdy$$
$$= \exp\{(-i\gamma/2\pi)G_x(x_0+\Delta x)t_x\}$$
$$\int\int M(x,y,z)R(x,y,z)\exp\{(-1\gamma/2\pi)(G_x x t_x + G_y y t_y)\}dxdy$$
$$= \exp\{(-i\gamma/2\pi)G_x \Delta x t_x\} \times S_0$$

According to the relationship above, (1) the signal $S_1$ after the resuming is multiplied by $\exp\{(-i\gamma/2\pi)G_x\Delta x t_x\}$, which is a phase corresponding to tx, or (2) a signal is detected while the phase of the reference frequency at the time of detection is shifted only by $\exp\{(i\gamma/2\pi)G_x\Delta x t_x\}$, thereby causing the same result as the case where a signal is detected by displacing the imaging plane.

In addition, in the present embodiment as shown in FIG. 3, the bed moving direction corresponds to the readout direction. However, the present invention is also applicable when the moving bed imaging is performed, setting the moving direction of the bed as the phase encoding direction (y-direction). Also in this case, considering the overrun at the pausing time and the accelerating distance at the time of resuming, the bed position is moved in the reverse direction, or the imaging position is adjusted. Adjustment of the imaging position can be implemented by changing the phase of a reference RF signal at the time of signal detection, every detection echo, or by changing the phase of the RF signal being detected, every detection echo. Specifically, when the imaging center at the time of pausing is assumed as (x, y)=(0, $y_0$), the signal $S_2$ at that timing is expressed by the equation (4), and the signal $S_3$ obtained by displacing the position of imaging slice only by Δy after the resuming is expressed by the equation (5).

[FORMULA 3]

$$S_2 = \int\int M(x,y,z)R(x,y,z) \quad (4)$$
$$\exp\{(-i\gamma/2\pi)\{G_x(x)t_x + G_y(y+y_0)t_y\}\}dxdy$$
$$= \exp\{(-i\gamma/2\pi)G_y y_0 t_y\}\int\int M(x,y,z)R(x,y,z)$$
$$\exp\{(-1\gamma/2\pi)(G_x x t_x + G_y(y+y_0+\Delta y)t_y)\}dxdy$$

-continued $$S_3 = \int\int M(x, y, z) R(x, y, z)$$
$$\exp\{(-i\gamma/2\pi)\{G_x(x + x_0 + \Delta x)t_x + G_y y t_y)\} dx dy \quad (5)$$
$$= \exp\{(-i\gamma/2\pi)G_x(y_0 + \Delta y)t_x\}$$
$$\int\int M(x, y, z)R(x, y, z)\exp\{(-1\gamma/2\pi)(G_x x t_x + G_y y t_y)\} dx dy$$
$$= \exp\{(-i\gamma/2\pi)G_y \Delta x t_y\} \times S_0$$

According to the relationship above, (1) the signal $S_3$ after the resuming is multiplied, every echo, by $\exp\{(-i\gamma/2\pi)Gy\Delta yty\}$ which is a phase corresponding to ty, or (2) a signal is detected while the phase of the reference frequency at the time of detection is shifted only by $\exp\{(i\gamma/2\pi)Gy\Delta yty\}$, every echo, thereby causing the same result as the case where a signal is detected by displacing the imaging plane.

When the bed moving direction and the phase encoding direction are the same, there is a possibility that aliasing of image may occur in the phase encoding direction. In order to handle this aliasing, for example, multiple receiving coils are arranged in the bed moving direction, and there is required a processing such as removing the aliasing by computation, using the signals from these receiving coils.

Next, there will be explained a second embodiment of the moving bed imaging employed by the MRI apparatus according to the present invention.

FIG. 7 shows the second embodiment of the moving bed imaging according to the present invention, and in this embodiment, a TRS plane (y, z plane) is set as the imaging plane, and imaging is performed slice by slice, while the bed is moved in the H-F direction (x-direction) of the test object 101. FIG. 7(a) and FIG. 7(b) are respectively a plan view and a side view, showing a relationship between the test object 101 and the imaging planes 701-1 and 701-2. FIG. 7(c) shows data items 702-1 to 702-3, after one slice of the image data is subjected to the Fourier transform in the readout direction.

As a pulse sequence for the imaging, a publicly known high-speed sequence can be employed, such as single shot FSE (high-speed spin echo method), single shot EPI (echo planar method), and high-speed GrE (gradient echo method). By way of example, multislice imaging is performed, setting the thickness of one slice to 5 mm, one-slice imaging time to 1 second, and the bed moving speed to 5 mm/s.

In this moving imaging, when a command of pausing is inputted at the time when imaging the imaging plane 701-1 is finished, as shown in FIG. 6(a), the bed is brought into halt after an overrun. In this state, if a command of resuming the imaging is inputted, the bed is moved until the moving speed reaches a predetermined speed, and thereafter the imaging is started. As a result, the imaging is started at a position displaced by the distance obtained by adding the overrun distance and the accelerating distance, and therefore data may be missing. As shown in FIG. 8(c), for example, if the imaging is brought into halt at the time when the data 702-1 is obtained, the subsequent data items 702-2 and 702-3 are not located at the original positions indicated by solid lines, and the sections 702'-2 and 702'-3 indicated by the dotted lines are measured. Therefore, also in this embodiment, if a command of pausing is inputted, the distance L1 of the overrun and the accelerating distance L2 are calculated, and the bed 112 is moved in the reverse direction by the obtained distance ($\Delta x$). When a command of resuming is inputted in this state, the imaging plane 701-2 is selected by performing an imaging in the same slice selection condition at the time when the imaging is started after the moving speed of the bed has reached a predetermined speed, and the imaging of continuous imaging planes can be performed, without missing any data.

Also in this embodiment, it is possible to shift the imaging plane by the distance of the bed movement ($\Delta x$), instead of moving the bed in the reverse direction. A shift of the imaging plane in the present embodiment can be implemented by changing the excited frequency after the resuming. Specifically, the slice selection is performed in the slice gradient magnetic field Gs expressed by the following equation (6), and the center frequency f0 of the irradiation RF pulse when the slice center position x0 is excited is expressed by the following equation (7).

[FORMULA 4]

$$G_s = G_{s0} \times x \quad (6)$$

$$f_0 = (\gamma/2\pi)G_{s0} \times x_0 \quad (7)$$

Therefore, in order to displace the position of the imaging plane after the resuming by $\Delta x$, the excided frequency f1 after the resuming is just changed to the following equation (8).

[FORMULA 5]

$$f_1 = (\gamma/2\pi)G_{s0} \times (x_0 + \Delta x) \quad (8)$$

Also in this present embodiment, since the imaging is restarted after compensating the moving distance of the bed, i.e., the distance from the pausing of imaging to the time when the imaging can be restarted, there is no data missing due to the movement of the bed, further, the data having been obtained until the pausing of imaging is not wasted, and it is possible to obtain an image without any deterioration of image quality just like an image when the imaging is performed continuously.

Hereinabove, there has been explained the embodiment of the present invention, where an image of COR section or TRS section is taken, while the bed is moved in the H-F direction. However, the imaging plane is not limited as described above. For example, the present invention may be applied to the case where an image of a sagittal section is taken. In addition, the phase encoding direction and the readout direction can be optionally changed. Therefore, the aforementioned equations (3), (5), and (8) are applied according to these directions, whereby changing of the imaging plane can be implemented.

As for the pulse sequence executed in the MRI apparatus of the present invention, in addition to the one exemplified in the above explanation, any imaging method is available, such as radial scan, and also 3D imaging is available instead of 2D imaging, as far as it is adjustable so that a relationship between the imaging speed and the bed moving speed is to be in a predetermined relationship.

INDUSTRIAL APPLICABILITY

The MRI apparatus of the present invention can be applied to various imaging, and for example, it is possible to obtain EPI-based diffusion weighted imaging (DWI), or FSE-based coronary imaging or a general-purpose T2 weighted image. In particular, as shown in FIG. 9, the MRI apparatus is configured in such a manner that the static magnetic field space is made to be thin in the body axis direction (for example, the imaging area is set to be around 64 mm). Accordingly, similar to an X-ray CT device, an image with a favorable SNR can be taken, while the bed is moved. Specifically, 3D imaging is taken with the slice thickness of 1 mm to 2 mm, and thereby drastically improving the SNR even with the thin slice. In addition, by employing 3D-TOF, the picture quality of non-contrast imaging is largely improved. Furthermore, a breathhold 3D imaging such as imaging of liver is carried out while the bed is moved, and thereby expanding the field of view.

BRIEF DESCRIPTION OF DRAWINGS

FIG. 3 includes illustrations showing a first embodiment of the moving bed imaging employed by the MRI apparatus according to the present invention;

FIG. 5 includes illustrations to explain data missing due to pausing and resuming of the moving bed imaging;

FIG. 6 includes illustrations to explain how to compensate the data missing;

FIG. 8 includes illustrations to explain the data missing due to pausing and resuming of the moving bed imaging.

DENOTATION OF REFERENCE NUMERALS

Figure 1:
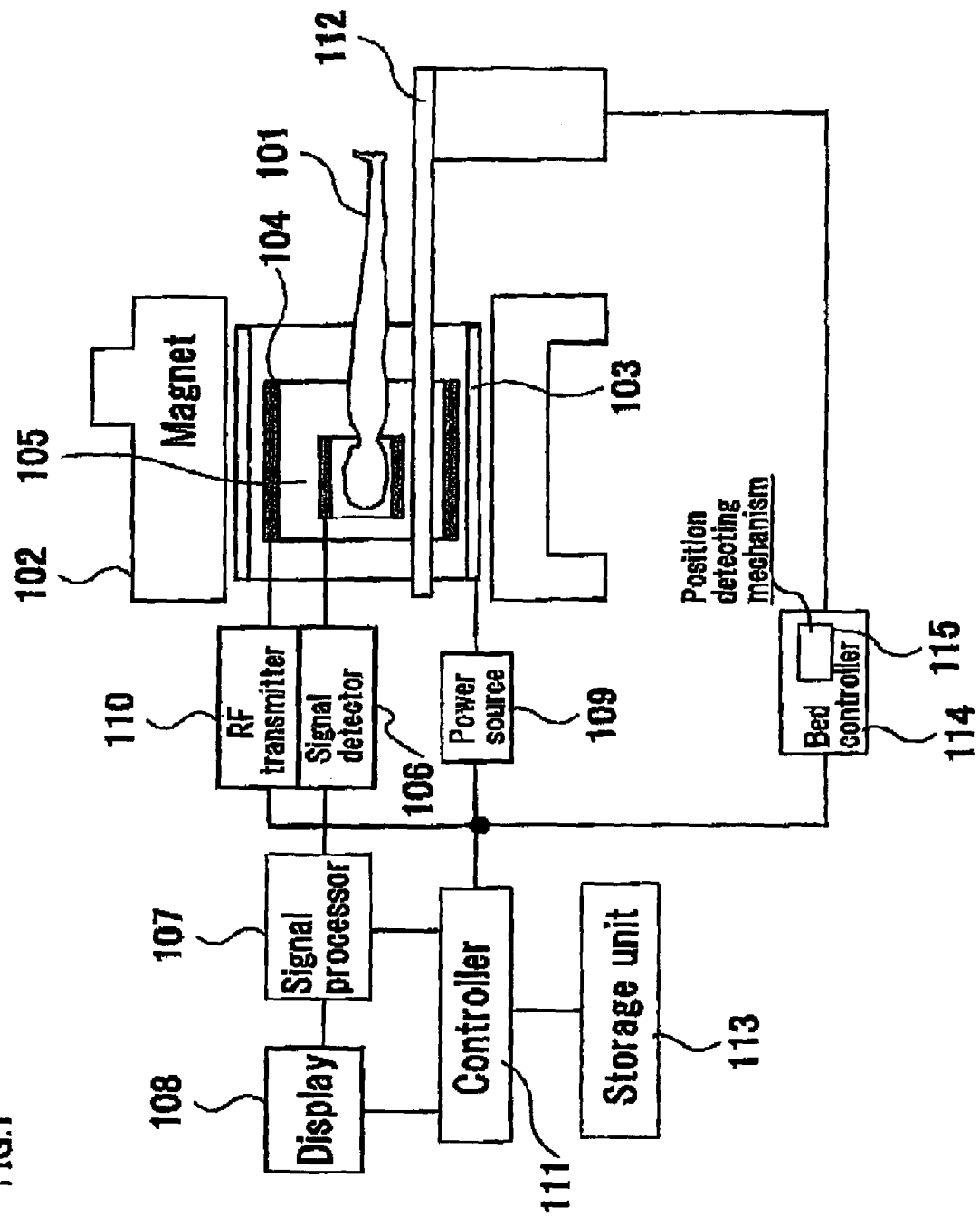
FIG. 1 is an illustration showing an overall configuration of an MRI apparatus to which the present invention is applied.
Figure 2:
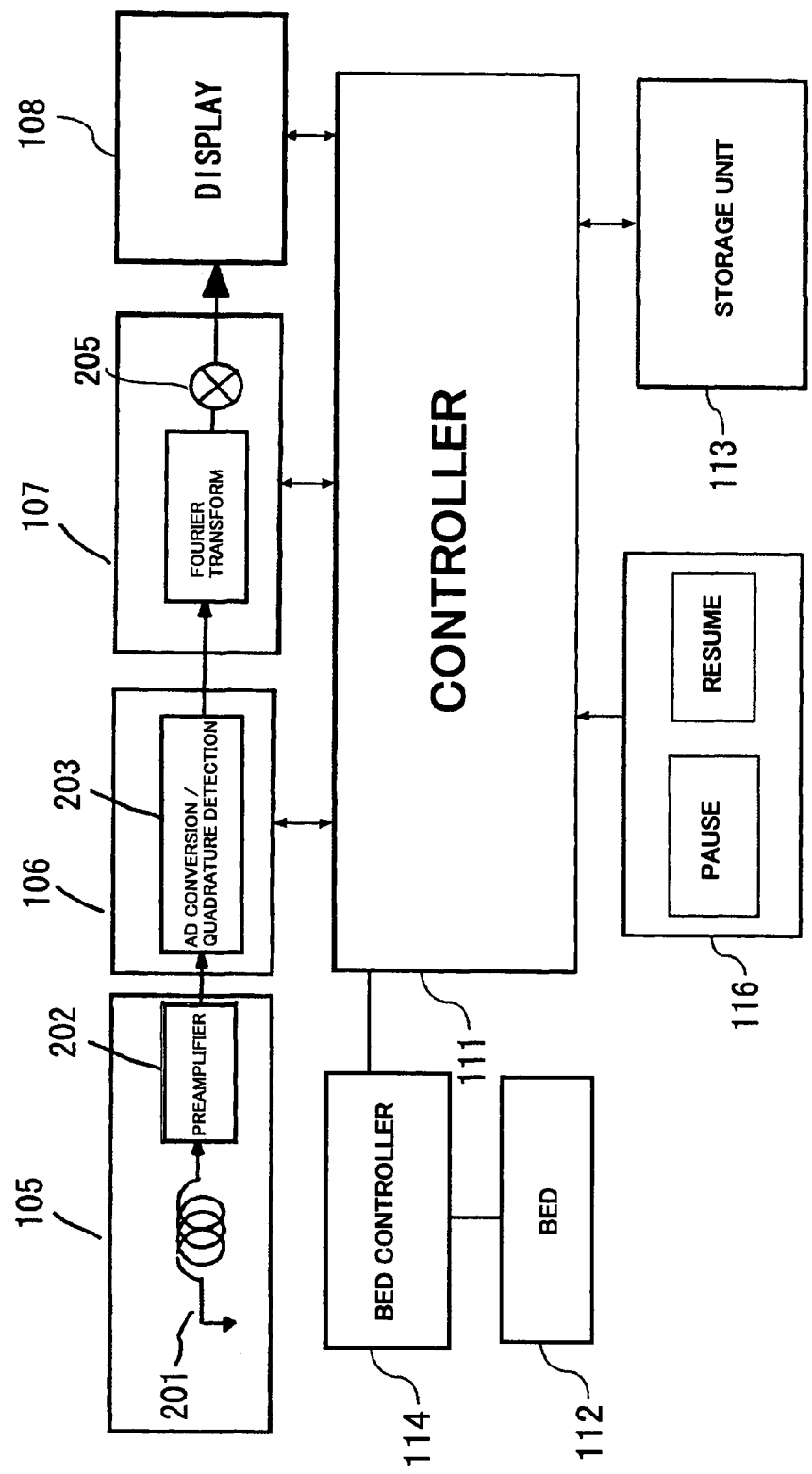
FIG. 2 is a block diagram to explain functions of a main portion of the MRI apparatus according to the present invention.
Figure 4:
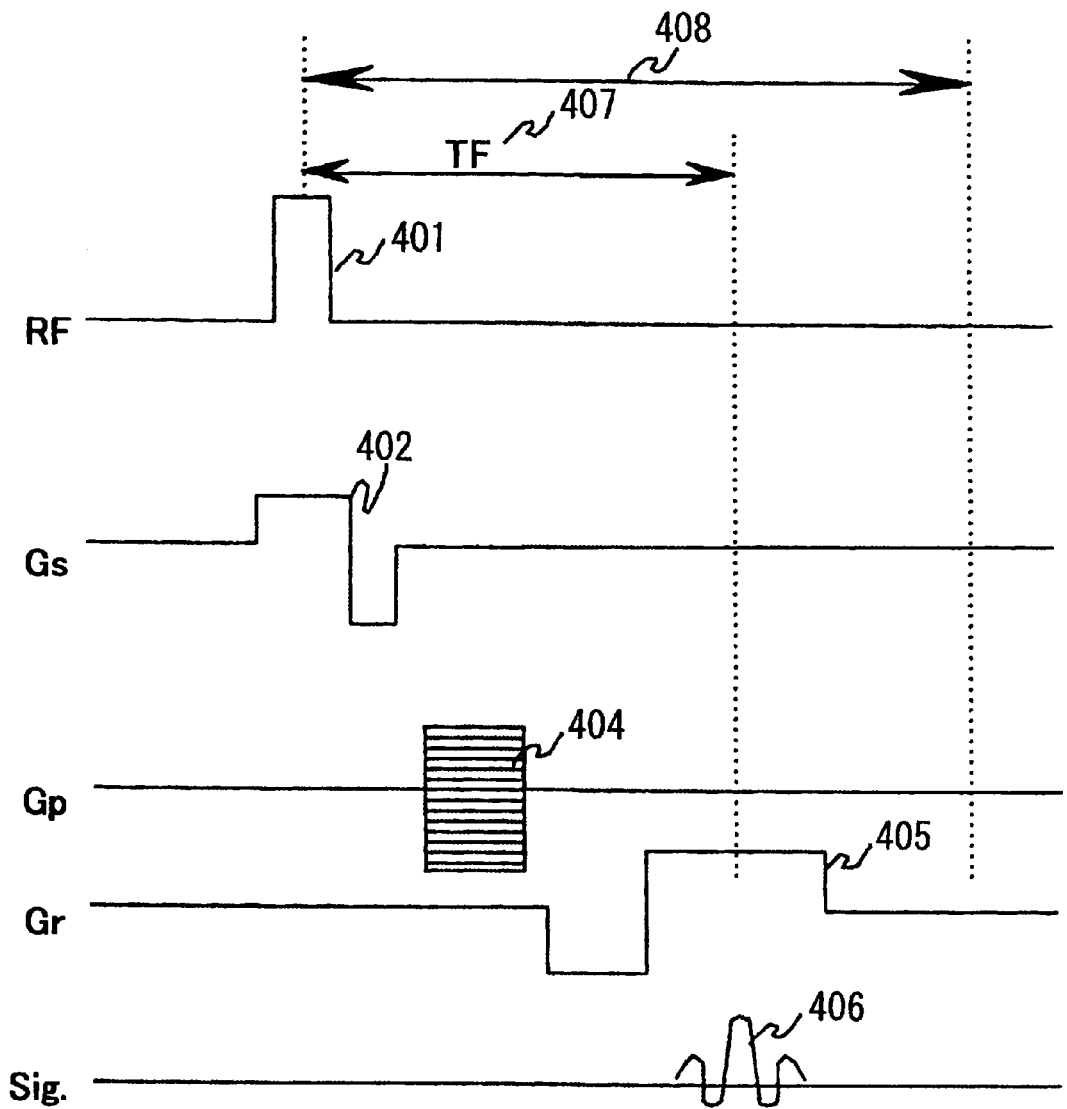
FIG. 4 is an illustration showing an example of pulse sequence which is suitable for the moving bed imaging.
Figure 7:
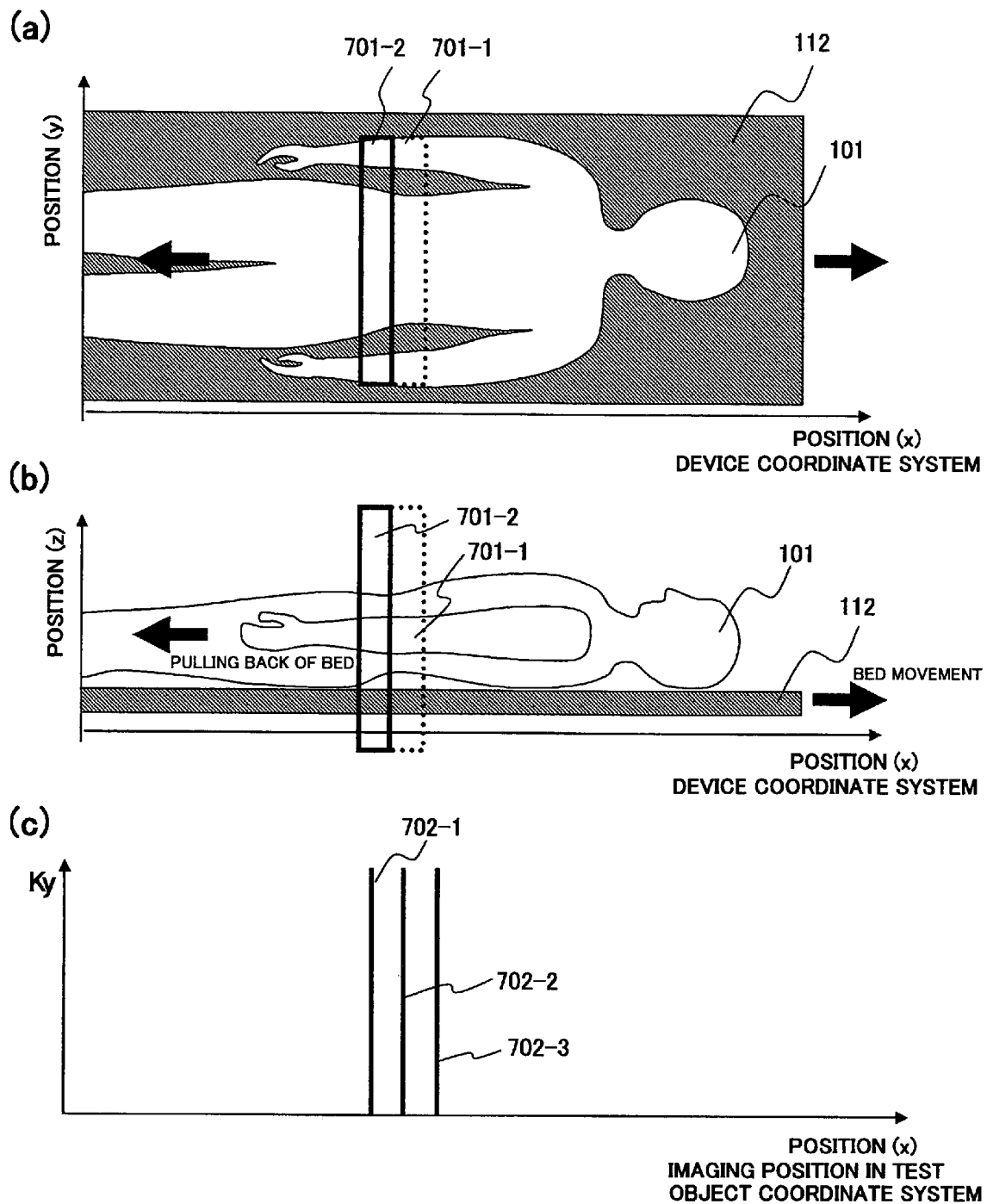
FIG. 7 includes illustrations showing a second embodiment of the moving bed imaging employed by the MRI apparatus according to the present invention.
Figure 9:
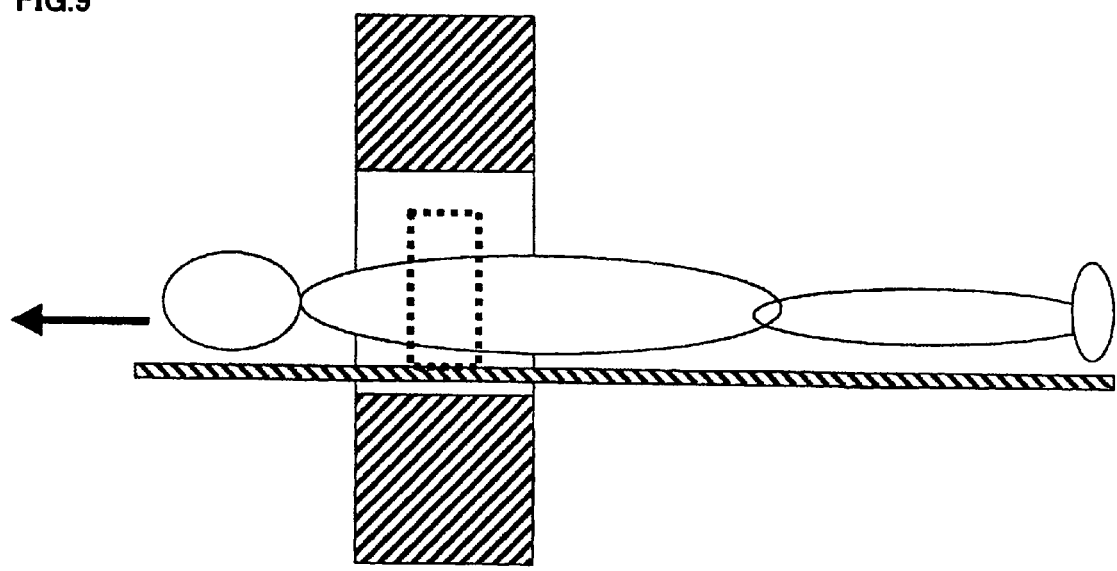
FIG. 9 is an illustration showing an overall configuration of the MRI apparatus to apply the present invention.

101 . . . TEST OBJECT, 102 . . . STATIC MAGNETIC FIELD MAGNET, 103 . . . GRADIENT MAGNETIC FIELD COIL, 104 . . . RF COIL, 105 . . . RF PROBE, 106 . . . SIGNAL DETECTOR, 107 . . . SIGNAL PROCESSOR, 108 . . . DISPLAY UNIT, 111 . . . CONTROLLER, 112 . . . BED, 113 . . . STORAGE UNIT, 114 . . . BED CONTROLLER, 115 . . . POSITION DETECTING MECHANISM, 116 . . . INPUT UNIT

What is claimed is:

1. A nuclear magnetic resonance imaging apparatus comprising, a static magnetic field generation means, a transfer means for moving a test object to a static magnetic field space generated by the static magnetic field generation means, an imaging means for applying a high-frequency magnetic field and a gradient magnetic field to the static magnetic field space, receiving a nuclear magnetic resonance signal generated from the test object, and forming a magnetic resonance image of the test object, a control means for controlling a movement by the transfer means and an imaging by the imaging means so that the imaging is performed while moving the transfer means, and an input means for sending to the control means, a command of pausing the imaging and a command of resuming the imaging, wherein the control means controls an operation of the transfer means and/or the imaging means at the time of resuming, based on moving distance of the transfer means between the time of receiving the command to pausing the imaging and the time of resuming the imaging, so that the position of the transfer means and/or the position of an imaging plane at the time of resuming the imaging become equal to the position of the transfer means and/ or the position of the imaging plane at the time of receiving the command of pausing the imaging.

2. The nuclear magnetic resonance imaging apparatus, according to claim 1, wherein, the control means controls an operation of the transfer means and/or the imaging means at the time of resuming, based on positional information of the transfer means at the time of receiving the command of pausing the imaging, and the positional information of the transfer means at the time of resuming the imaging.

3. The nuclear magnetic resonance imaging apparatus, according to claim 2, wherein, the control of the operation of the transfer means and/or the imaging means at the time of resuming is conducted in such a manner as compensating a data missing caused by a difference of positional information (moving distance) between the time of receiving the command of pausing the imaging and the time of resuming the imaging.

4. The nuclear magnetic resonance imaging apparatus according to claim 1, wherein the moving distance of the transfer means is a distance obtained by adding an overrun distance until the transfer means stops after a receipt of the command of pausing, to an accelerating distance that the transfer means moves until the imaging is started after the transfer means restarts moving by the command of resuming.

5. The nuclear magnetic resonance imaging apparatus, according to claim 4, wherein, the overrun distance and/or the accelerating distance are calculated, by using a moving speed of the transfer means at the time of imaging.

6. The nuclear magnetic resonance imaging apparatus according to claim 1, wherein the transfer means is provided with a position detecting mechanism, and the control means calculates the moving distance based on a position of the transfer means, the position being detected by the position detecting mechanism.

7. The nuclear magnetic resonance imaging apparatus according to claim 1, wherein the control means compensates the data missing by pulling back the position of the transfer mean when an operation of the imaging means is resumed, by the same distance as the moving distance.

8. The nuclear magnetic resonance imaging apparatus, according to claim 1, wherein the control means compensates the data missing, by shifting a position of the imaging plane when an operation of the imaging means is resumed, by the same distance as the moving distance.

9. The nuclear magnetic resonance imaging apparatus, according to claim 8, wherein the control means shifts the position of the imaging plane by changing a phase of a reference RF signal at the time of signal detection for each signal or by changing a phase of the detected NMR signal for each signal.

10. The nuclear magnetic resonance imaging apparatus, according to claim 9, wherein the phase is changed by $\exp\{(-i\gamma/2\pi)Gx\Delta x tx\}$, where $\gamma$ represents a gyromagnetic ratio, Gx represents a gradient magnetic field intensity in an x-direction, $\Delta x$ represents a displacement of the imaging plane in the x-direction, and tx represents an application time of the x-direction gradient magnetic field.

11. The nuclear magnetic resonance imaging apparatus, according to claim 1, wherein, the control means sets a plane parallel to a moving direction of the transfer means as an imaging plane, and controls the imaging means in such a manner that an application direction of a readout gradient magnetic field that is applied when the nuclear magnetic resonance signal is acquired is made to be the same as the moving direction of the transfer means.

12. The nuclear magnetic resonance imaging apparatus, according to claim 11, wherein,
the imaging plane is a coronal section or a sagittal section of the test object.

13. The nuclear magnetic resonance imaging apparatus according to claim 11, further comprising a storage unit for storing data of a part of phase-encoding steps that has been obtained until the pausing.

14. The nuclear magnetic resonance imaging apparatus according to claim 13, wherein
the imaging means reconstructs an image, by using data of complete phase-encoding steps, a part of which has been obtained until the pausing and the rest of which has been obtained after the resuming.

15. The nuclear magnetic resonance imaging apparatus, according to claim 13, wherein,
the imaging means reconstructs an image by using the part of the data obtained until the pausing, and further reconstructs an image by using another part of the data obtained until the pausing and the data obtained after the resuming.

16. The nuclear magnetic resonance imaging apparatus, according to claim 1, wherein,
the control means controls the imaging means in such a manner that a plane orthogonal to the moving direction of the transfer means is made to be an imaging plane.

17. The nuclear magnetic resonance imaging apparatus, according to claim 1, wherein the control means sets a plane parallel to a moving direction of the transfer means as an imaging plane, and controls the imaging means in such a manner that an application direction of a phase encoding gradient magnetic field is made to be the same as the moving direction of the transfer means.

18. The nuclear magnetic resonance imaging apparatus, according to claim 17, wherein, the control means changes the position of an imaging plane at the time of resuming the imaging by changing a phase of a reference RF signal at the time of signal detection for each signal or by changing a phase of the detected NMR signal for each signal.

19. The nuclear magnetic resonance imaging apparatus, according to claim 18, wherein
the phase is changed by $\exp\{(-i\gamma/2\pi) Gy\Delta y ty\}$,
where $\gamma$ represents a gyromagnetic ratio,
Gy represents a gradient magnetic field intensity in a y-direction,
$\Delta y$ represents a displacement of the imaging plane in the y-direction, and
ty represents an application time of the y-direction gradient magnetic field.

20. A nuclear magnetic resonance imaging method, comprising the steps of:
(1) taking an image of a test object, while allowing movement of the test object on which a high-frequency magnetic field and a gradient magnetic field are applied and receiving a nuclear magnetic resonance signal,
(2) pausing the imaging and the movement, and
(3) resuming the imaging and the movement, wherein, the nuclear magnetic resonance imaging method further comprises the steps of:
(4) detecting a pausing position of the test object being paused and a resuming position of the test object being resumed, and
(5) controlling the movement and the imaging of the test object at the time of resuming in such a manner as compensating data missing, based on a difference between the pausing position and the resuming position, where the data missing occurs due to the difference.

21. The nuclear magnetic resonance imaging method, according to claim 20, wherein,
the step (1) comprises the steps of,
(6) storing the nuclear magnetic resonance signal obtained until the pausing, and
(7) storing the nuclear magnetic resonance signal obtained after the resuming, and further comprises,
the step of (8) reconstructing an image based on the nuclear magnetic resonance signals obtained in the step (6) and in the step (7).

22. The nuclear magnetic resonance imaging method, according to claim 20, comprising the step of,
(9) obtaining as a moving distance, a difference between a position of the test object when the command of pausing is sent in the step (2), and a position of the test object when the imaging is started in the step (3).

23. The nuclear magnetic resonance imaging method, according to claim 22, wherein,
the step (9) comprises the step of,
(10) obtaining a distance by the overrun after sending the command of pausing the movement of the test object.

* * * * *